United States Patent
Kwon et al.

(10) Patent No.: US 9,384,832 B2
(45) Date of Patent: Jul. 5, 2016

(54) MEMORY DEVICE AND METHOD OF OPERATING THE SAME

(71) Applicant: SAMSUNG ELECTRONICS CO., LTD., Suwon-Si, Gyeonggi-Do (KR)

(72) Inventors: Hyo-Jin Kwon, Seoul (KR); Yeong-Taek Lee, Seoul (KR); Dae-Seok Byeon, Seongnam-Si (KR)

(73) Assignee: Samsung Electronics Co., Ltd., Suwon-si, Gyeonggi-do (KR)

( * ) Notice: Subject to any disclaimer, the term of this patent is extended or adjusted under 35 U.S.C. 154(b) by 0 days.

(21) Appl. No.: 14/791,636

(22) Filed: Jul. 6, 2015

(65) Prior Publication Data

US 2016/0133323 A1    May 12, 2016

(30) Foreign Application Priority Data

Nov. 7, 2014 (KR) .......................... 10-2014-0154738

(51) Int. Cl.
    *G11C 13/00*    (2006.01)
(52) U.S. Cl.
    CPC .................................. *G11C 13/0069* (2013.01)
(58) Field of Classification Search
    USPC ................................................. 365/148, 163
    See application file for complete search history.

(56) References Cited

U.S. PATENT DOCUMENTS

| 6,839,269 | B2 | 1/2005 | Iwata et al. | |
| 7,417,887 | B2 | 8/2008 | Cho et al. | |
| 7,920,408 | B2 | 4/2011 | Azuma et al. | |
| 7,936,586 | B2 | 5/2011 | Hosono et al. | |
| 8,477,525 | B2* | 7/2013 | Ito | G11C 7/14 365/148 |
| 8,665,634 | B2 | 3/2014 | Minemura et al. | |
| 8,705,266 | B2 | 4/2014 | Sasaki | |
| 9,183,932 | B1* | 11/2015 | Kwon | G11C 13/0069 |
| 2007/0297247 | A1* | 12/2007 | Hemink | G11C 11/5628 365/185.33 |
| 2014/0104923 | A1 | 4/2014 | Baek et al. | |
| 2014/0104930 | A1 | 4/2014 | Deguchi et al. | |

FOREIGN PATENT DOCUMENTS

JP    KR0827518    4/2008
JP    20110054226    3/2011

* cited by examiner

*Primary Examiner* — Hoai V Ho
*Assistant Examiner* — Minh Dinh
(74) *Attorney, Agent, or Firm* — Volentine & Whitt, PLLC

(57) ABSTRACT

A method is for operating a memory device including a plurality of memory cells disposed in regions where a plurality of first signal lines and a plurality of second signal lines cross each other. The method includes applying an initial voltage to the plurality of first signal lines, floating the plurality of first signal lines to which the initial voltage is applied, applying a second inhibit voltage to the plurality of second signal lines, and increasing voltage levels of the plurality of first signal lines to a first inhibit voltage level via capacitive coupling between the plurality of first signal lines which are floated and the plurality of second signal lines to which the second inhibit voltage is applied.

20 Claims, 18 Drawing Sheets

EL1  DS  EL2

MEMORY DEVICE AND METHOD OF OPERATING THE SAME

CROSS-REFERENCE TO RELATED APPLICATION

A claim of priority is made to Korean Patent Application No. 10-2014-0154738, filed on Nov. 7, 2014, in the Korean Intellectual Property Office, the disclosure of which is incorporated herein in its entirety by reference.

BACKGROUND

The inventive concepts are generally directed to memory devices and to methods of operating memory devices.

In response to continued demand for memory devices having increased storage capacity and decreased power consumption, research into next-generation memory devices is being widely conducted. In order to can acceptance in the market, a next-generation memory device will desirably have the high data integrity characteristics of dynamic random access memory (DRAM), the non-volatile and mass storage characteristics of flash memory, and high speed operational characteristics of static RAM (SRAM). Examples of next-generation memory technologies to which particular attention has been paid include phase change RAM (PRAM), nano floating gate memory (NFGM), polymer RAM (PoRAM), magnetic RAM (MRAM), ferroelectric RAM (FeRAM), and resistive RAM (RRAM).

SUMMARY

According to an aspect of the inventive concepts, there is provided a method of operating a memory device including a plurality of memory cells disposed in regions where a plurality of first signal lines and a plurality of second signal lines cross each other, the method including: applying an initial voltage to the plurality of first signal lines; floating the plurality of first signal lines to which the initial voltage is applied; applying a second inhibit voltage to the plurality of second signal lines; and increasing voltage levels of the plurality of first signal lines to a first inhibit voltage level through capacitive coupling between the plurality of first signal lines which are floated and the plurality of second signal lines to which the second inhibit voltage is applied.

According to another aspect of the inventive concepts, there is provided a method of operating a memory device including a plurality of memory cells disposed in regions where a plurality of first signal lines and a plurality of second signal lines cross each other, the method including: floating the plurality of first signal lines and applying a second inhibit voltage to the plurality of second signal lines in an inhibit section, and thus, increasing voltage levels of the plurality of first signal lines to a first inhibit voltage level through capacitive coupling between the plurality of first signal lines that are floated and the plurality of second signal lines to which the second inhibit voltage is applied; and applying a write voltage to any one of a selected first signal line and a selected second signal line connected to a selected memory cell in a write section.

According to another aspect of the inventive concepts, there is provided a method of operating a memory system including a memory controller and a memory device. The memory device includes a plurality of memory cells disposed in regions where a plurality of first signal lines and a plurality of second signal lines cross each other. The method includes: transmitting a write command from the memory controller to the memory device; and performing a write operation on a selected memory cell, in response to the write command. The performing of the write operation includes: floating the plurality of first signal lines and applying a second inhibit voltage to the plurality of second signal lines in an inhibit section, and thus, increasing voltage levels of the plurality of first signal lines to a first inhibit voltage level through capacitive coupling between the plurality of first signal lines that are floated and the plurality of second signal lines to which the second inhibit voltage is applied; and applying a write voltage to any one of a selected first signal line and a selected second signal line connected to the selected memory cell in a write section.

BRIEF DESCRIPTION OF THE DRAWINGS

Exemplary embodiments of the inventive concepts will be more clearly understood from the detailed description that follows with reference to the accompanying drawings, in which.

DETAILED DESCRIPTION OF THE EMBODIMENTS

Figure 1:
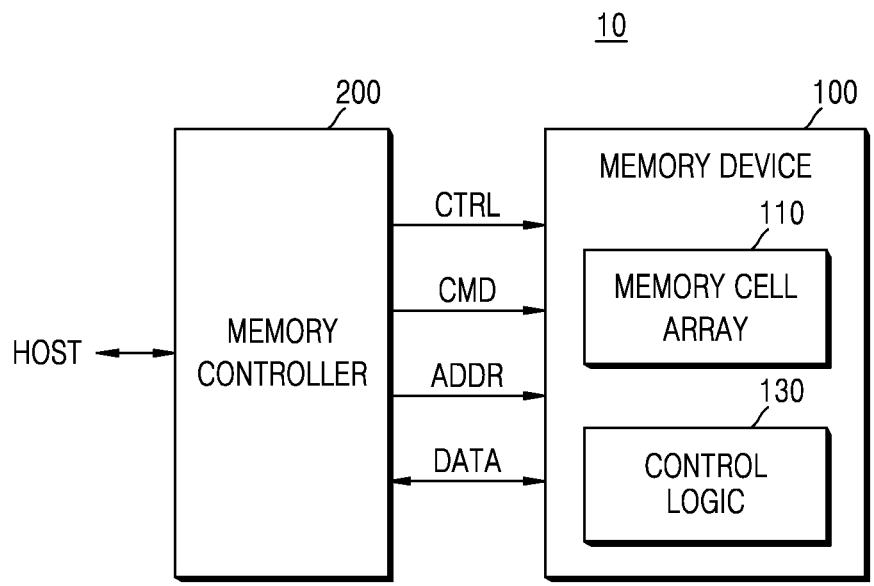
FIG. 1 is a schematic block diagram of a memory system according to an exemplary embodiment of the inventive concepts.

The inventive concepts will now be described more fully with reference to the accompanying drawings, in which exemplary embodiments of the inventive concepts are shown. The inventive concepts may, however, be embodied in many different forms and should not be construed as being limited to the exemplary embodiments set forth herein; rather, these exemplary embodiments are provided so that this disclosure will be thorough and complete, and will fully convey the inventive concepts to those of ordinary skill in the art. It is to be appreciated that all changes, equivalents, and substitutes that do not depart from the spirit and technical scope of the inventive concepts are encompassed in the inventive concepts. Like reference numerals in the drawings denote like elements. In the drawings, the thicknesses of layers and regions are exaggerated for clarity.

The terms used in the present specification are merely used to describe particular exemplary embodiments, and are not intended to limit the inventive concepts. An expression used in the singular encompasses the expression of the plural, unless it has a clearly different meaning in the context. In the present specification, it is to be understood that the terms such as "including", "having", and "comprising" are intended to indicate the existence of the features, numbers, steps, actions, components, parts, or combinations thereof disclosed in the specification, and are not intended to preclude the possibility that one or more other features, numbers, steps, actions, components, parts, or combinations thereof may exist or may be added.

It will be understood that although the terms "first", "second", etc. may be used herein to describe various components, these components should not be limited by these terms. These components are only used to distinguish one component from another. For example, a first component may be referred to as a second component, and similarly, a second component may be referred to as a first component.

Unless otherwise defined, all terms (including technical and scientific terms) used herein have the same meaning as commonly understood by one of ordinary skill in the art to which this inventive concepts belong. It will be further understood that terms, such as those defined in commonly used dictionaries, should be interpreted as having a meaning that is consistent with their meaning in the context of the relevant art and will not be interpreted in an idealized or overly formal sense unless expressly so defined herein.

FIG. 1 is a schematic block diagram of a memory system 10 according to an exemplary embodiment of the inventive concepts.

Referring to FIG. 1, the memory system 10 may include a memory device 100 and a memory controller 200. The memory device 100 may include a memory cell array 110 and a control logic 130.

In response to a write/read request from a host, a memory controller 200 may control the memory device 100 to read data stored in the memory device 100 or to write data into the memory device 100. In detail, the memory controller 200 may provide the memory device 100 with an address ADDR, a command CMD, and a control signal CTRL and thus may control a programming (or write) operation, a read operation, and an erase operation of the memory device 100. Also, data DATA for a programming operation and read data DATA may be transmitted or received between the memory controller 200 and the memory device 100.

Although not illustrated, the memory controller 200 may include a random access memory (RAM), a processing unit, a host interface, and a memory interface. The RAM may be used as an operation memory of the processing unit, and the processing unit may control operations of the memory controller 200. The host interface may include a protocol used to exchange data between a host and the memory controller 200. For example, the memory controller 200 may communicate with an external host via at least one of various interface protocols such as a universal serial bus (USB), a multimedia card (MMC), a peripheral component interconnection-express (PCI-E), an advanced technology attachment (ATA), a serial-ATA, a parallel-ATA, a small computer system interface (SCSI), an enhanced small device interface (ESDI), and an integrated drive electronics (IDE).

The memory cell array 110 may include a plurality of memory cells (not shown) that are disposed respectively in regions where a plurality of first signal lines and a plurality of second signal lines cross each other. According to an exemplary embodiment, the first signal lines may be word lines, and the second signal lines may be bit lines. According to another exemplary embodiment, the first signal lines may be bit lines, and the second signal lines may be word lines. The memory device 100 including the memory cell array 110 as described above may be referred to as a cross point memory device.

According to an exemplary embodiment, each of the memory cells may be a single-level cell (SLC) that stores 1-bit data, and the memory cells may have one of two resistance states in accordance with stored data. According to another exemplary embodiment, each of the memory cells may be a multi-level cell (MLC) that stores 2-bit data, and the memory cells may have four resistance states in accordance with stored data. According to another exemplary embodiment, each of the memory cells may be a MLC that stores 3-bit data (also called a triple-level cell (TLC)), and the memory cells may have eight resistance states in accordance with stored data. However, the inventive concepts are not limited thereto, and according to another exemplary embodiment, the memory cell array 110 may include an SLC and/or an MLC and/or a TLC.

According to the present exemplary embodiment, the plurality of memory cells may include resistance-type memory cells or resistive memory cells that include a variable resistor device (not shown) having a variable resistance. For example, when resistance of the variable resistor device that is formed of a phase change material (e.g., Ge—Sb—Te) is changed according to a thermal treatment, a resistive memory device may be a phase change RAM (PRAM). As another example, when the variable resistor device is formed of an upper electrode, a lower electrode, and a transition metal oxide (complex metal oxide) therebetween, the memory device 100 may be a resistive RAM (ReRAM). As another example, when the variable resistor device is formed of an upper electrode of a magnetic material, a lower electrode of a magnetic material, and a dielectric therebetween, the memory device 100 may be a magnetic RAM (MRAM).

In the present exemplary embodiment, when a write operation or read operation is performed on the memory cell array 110, different voltages may be respectively applied to selected signal lines connected to a selected memory cell and non-selected signal lines connected to a non-selected memory cell. In detail, an operating voltage (for example, a set write voltage, a reset write voltage, a read voltage, etc.) may be applied to the selected lines for a write operation or a read operation. An inhibit voltage (or a cut-off voltage) may be applied to the non-selected signal lines in order to block a false operation of the non-selected memory cell.

According to an exemplary embodiment, voltage of non-selected signal lines disposed adjacent to the selected signal lines from among the non-selected signal lines (hereinafter, referred to as 'adjacent non-selected signal lines') may be controlled to be different from a voltage of signal lines that are not disposed adjacent to the selected signal lines from among the non-selected signal lines (hereinafter, referred to as 'normal non-selected signal lines'). The adjacent non-selected signal lines may be at a changed voltage level due to an operating voltage applied to the selected signal lines. The changed voltage of the adjacent non-selected signal lines may reduce the leakage current that flows through the non-selected memory cell that is connected to the adjacent non selected signal lines.

The control logic 130 may control overall operations of the memory device 100. In the present exemplary embodiment, the control logic 130 may control levels of voltages applied to the first and second signal lines connected to the memory device 100 or timings at which the voltages are applied. The voltages may include operating voltages applied to selected first and second signal lines and inhibit voltages applied to non-selected first and second signal lines.

In more detail, the control logic 130 may set a level of a first inhibit voltage of the first signal lines and a level of a second inhibit voltage of the second signal lines in order to initialize the first and second signal lines before a write operation is performed on the selected memory cell. Also, the control logic 130 may control timings at which predetermined voltages are applied to the first and second signal lines so that the first and second signal lines may respectively be at levels of the first and second inhibit voltages. In the present exemplary embodiment, the control logic 130 may control the level of the first inhibit voltage, the level of the second inhibit voltage, and the timings at which the predetermined voltages are applied to the first and second signal lines so as to increase levels of the first and second signal lines through capacitive coupling between the first and second signal lines.

When the level of the first inhibit voltage or the level of the second inhibit voltage is greater than a level of an external power voltage applied to the memory device 100, the memory device 100 needs to include a peripheral circuit, for example, a charge pump, which is used to generate a voltage greater than the external power voltage. Also, as the number of the non-selected signal lines requiring the first inhibit voltage or the second inhibit voltage having a greater level than the external power voltage increases, a capacity of the charge pump is increased, and thus, an area of the memory device 100 which is occupied by the charge pump is increased. As a result, power consumed to operate the charge pump is increased.

In the present exemplary embodiment, the voltage level of the first signal lines or the voltage level of the second signal lines may be increased to the level of the first inhibit voltage or the level of the second inhibit voltage through the capacitive coupling between the first and second signal lines. Therefore, the level of the first inhibit voltage or the level of the second inhibit voltage which is greater than the level of the external power voltage may be accomplished even without a charge pump circuit.

The memory controller 200 and the memory device 100 may be integrated in one semiconductor device. For example, the memory controller 200 and the memory device 100 may be integrated in the semiconductor device and thus may configure a memory card. For example, the memory controller 200 and the memory device 100 may be integrated in the semiconductor device and thus may configure a PC card (a PCMCIA card), a compact flash card (CF card), a smart media card (SM/SMC), a memory stick, a multimedia card (MMC, RS-MMC, or MMCmicro), an SD card (SD, miniSD, or microSD), or a universal flash storage (UFS). As another example, the memory controller 200 and the memory device 100 may be integrated in the semiconductor device and thus may configure a Solid State Disk/Drive (SSD).

Figure 2:
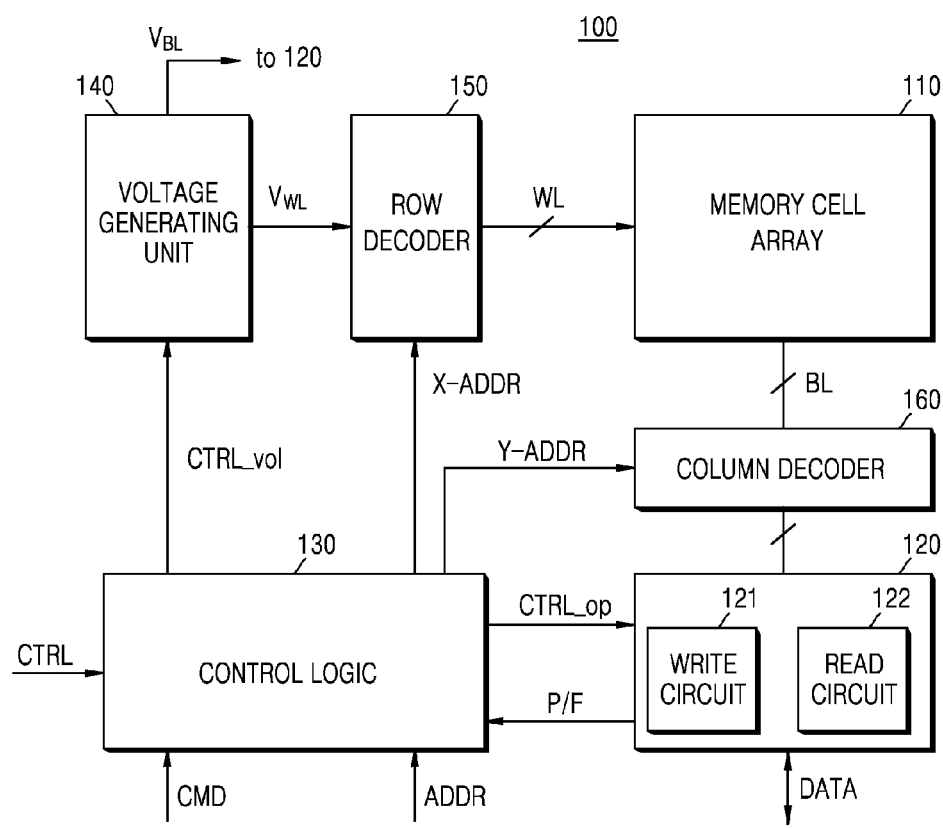
FIG. 2 is a block diagram illustrating an example of a memory device of FIG. 1.

FIG. 2 is a block diagram illustrating an example of the memory device 100 included in the memory system 10 of FIG. 1 according to an exemplary embodiment.

Referring to FIG. 2, the memory device 100 may include the memory cell array 110, a write/read circuit 120, the control logic 130, a voltage generating unit 140, a row decoder 150, and a column decoder 160, and the write/read circuit 120 may include a write circuit 121 and a read circuit 122. Hereinafter, elements included in the memory device 100 will be described in detail.

The memory cell array 110 may be connected to a plurality of first signal lines and a plurality of second signal lines. Also, the memory cell array 110 may include a plurality of memory cells that are respectively disposed in regions where the first and second signal lines cross each other. Hereinafter, one or more exemplary embodiments of the inventive concepts are described below while it is assumed that the first signal lines are word lines WL, and the second signal lines are bit lines BL.

Figure 3:
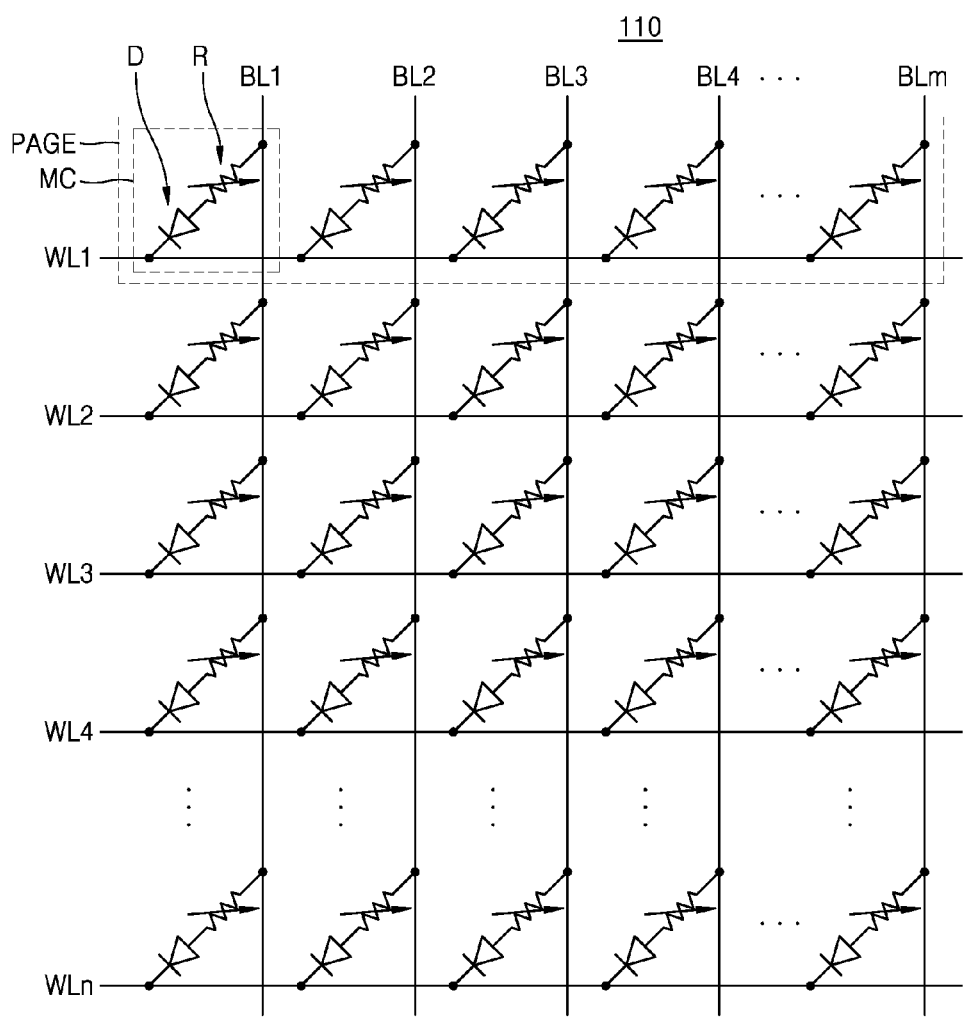
FIG. 3 is a circuit diagram of an example of a memory cell array of FIG. 2.

FIG. 3 is a circuit diagram of an example of the memory cell array 110 of FIG. 2.

Referring to FIG. 3, the memory cell array 110 may be disposed in a two-dimensional memory device, and may include a plurality of word lines WL1 through WLn, a plurality of bit lines BL1 through BLm, and a plurality of memory cells MC. The number of word lines WL, bit lines BL, and memory cells MC may be different according to exemplary embodiments. The exemplary embodiments of the inventive concepts are not limited to the two-dimensional memory, and according to another exemplary embodiment, the memory cell array 110 may be disposed in a three-dimensional memory device.

According to the present exemplary embodiment, each of the plurality of memory cells MC may include a variable resistor device R and a selection device D. The variable resistor device R may include a variable resistance material, and the selection device D may be a switching device such as PN diode or MOS transistor.

According to an exemplary embodiment, the variable resistor device R is connected between one of a plurality of bit lines BL1 through BLm and the selection device D, and the selection device D may be connected between the variable resistor device R and one of a plurality of word lines WL1 through WLn. However, the exemplary embodiments of the inventive concepts are not limited thereto, and the selection device D may be connected between one of a plurality of bit lines BL1 through BLm and the variable resistor device R, and the variable resistor device R may be connected between the selection device D and one of a plurality of word lines WL1 through WLn.

The selection device D may be connected between any one of the plurality of word lines WL1 through WLn and the variable resistor device R, and may control a current supply to the variable resistor device R according to a voltage applied to the connected word line and bit line. While a diode is illustrated as the selection device D in FIG. 3, this is merely an exemplary embodiment of the inventive concepts, and according to another exemplary embodiment, the selection device D may be replaced by other switchable device.

Figure 4:
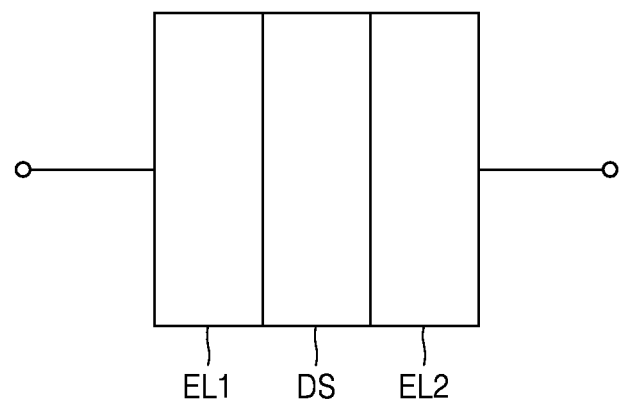
FIG. 4 illustrates an example of a variable resistor device of FIG. 3.

FIG. 4 illustrates the variable resistor device R included in the memory cell MC of FIG. 3 according to an exemplary embodiment.

Referring to FIG. 4, the variable resistor device R may include first and second electrodes EL1 and EL2 and a data storage film DS disposed between the first and second electrodes EL1 and EL2.

The first and second electrodes EL1 and EL2 may be formed of various metals, metal oxides, or metal nitrides. The first and second electrodes EL1 and EL2 may be formed of aluminum (Al), copper (Cu), a titanium nitride (TiN), a titanium aluminum nitride (TixAlyNz), iridium (Ir), platinum (Pt), silver (Ag), gold (Au), polysilicon, tungsten (W), titanium (Ti), tantalum (Ta), tantalum nitride (TaN), tungsten nitride (WN)), nickel (Ni), cobalt (Co), chromium (Cr), antimony (Sb), iron (Fe), molybdenum (Mo), palladium (Pd). Tin (Sn). Zirconium (Zr), zinc (Zn), iridium oxide ($IrO_2$), strontium zirconate ($StZrO_3$), or the like.

The data storage film DS may be formed of a bipolar resistance memory material or a unipolar resistance memory material. The bipolar resistance memory material may be programmed in a set or reset state via a polarity of a pulse, and Perovskite-based material may be used as the bipolar resistance memory material. The unipolar resistance memory material may be programmed in a set or reset state through a pulse of the same polarity, and transition metal oxides such as NiOx or TiOx may be used as the unipolar resistance memory material.

FIGS. 5A through 5D are circuit diagrams of other examples of the memory cell MC of FIG. 4.

Figure 5A:
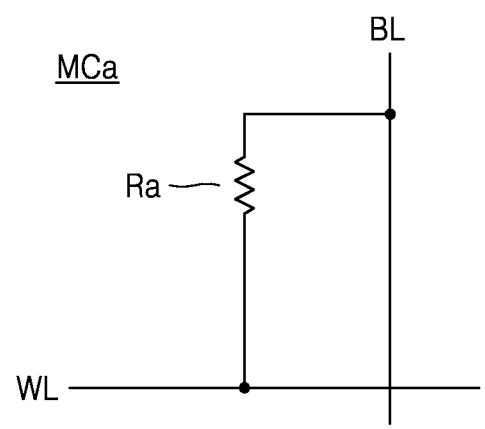
FIGS. 5A through 5D are circuit diagrams of modified examples of a memory cell of FIG. 4.

Referring to FIG. 5A, a memory cell MCa may include a variable resistor device Ra that may be connected between a bit line BL and a word line WL. The memory cell MCa may store data due to voltages that are applied to the bit line BL and the word line WL, respectively.

Figure 5B:
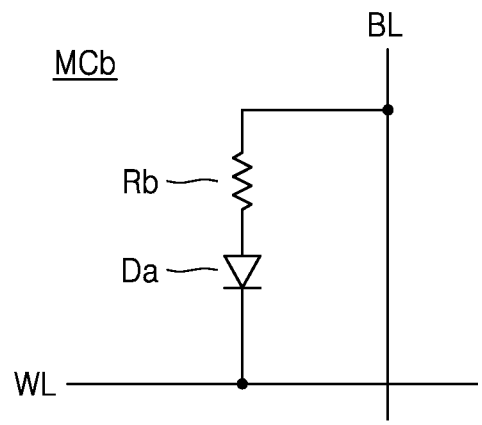

Referring to FIG. 5B, a memory cell MCb may include a variable resistor device Rb and a unidirectional diode Da. The variable resistor device Rb may include a resistive material to store data. The unidirectional diode Da may be a selection device that supplies or blocks a current to the variable resistor device R according to a bias between the word line WL and the bit line BL. The unidirectional diode Da may be connected between the variable resistor device Rb and the word line WL, and the variable resistor device Rb may be connected between the bit line BL and the unidirectional diode Db. Positions of the unidirectional diode Db and the variable resistor device Rb may be changed with respect to each other.

According to an exemplary embodiment, the unidirectional diode Da may be a PN junction diode or a PIN junction diode, and an anode of the unidirectional diode Da may be connected to the variable resistor device Rb, and a cathode of the unidirectional diode Da may be connected to one of a plurality of word lines WL1 through WLn. According to another exemplary embodiment, a cathode of the unidirectional diode Da may be connected to the variable resistor device Rb, and an anode of the unidirectional diode Da may be connected to one of a plurality of word lines WL1 through WLn. In this case, if a voltage difference between the anode and the cathode of the unidirectional diode Da is greater than a threshold voltage of the unidirectional diode Da, the unidirectional diode Da is turned on to supply a current to the variable resistor device Ra.

Figure 5C:
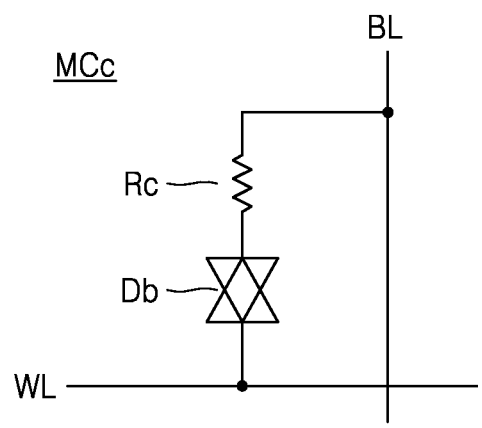

Referring to FIG. 5C, a memory cell MCc may include a variable resistor device Rc and a bidirectional diode Db. The variable resistor device Rc may include a resistive material so as to store data. The bidirectional diode Db may be connected between the variable resistor device R and a word line WL, and the variable resistor device Rc may be connected between a bit line BL and the bidirectional diode Db. Positions of the bidirectional diode Db and the variable resistor device Rc may be changed with respect to each other. By using the bidirectional diode Db, the leakage current that may flow to the non-selected resistor cell may be reduced.

Figure 5D:
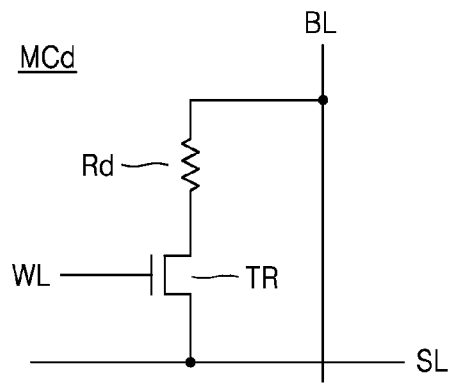

Referring to FIG. 5D, a memory cell MCd may include a variable resistor device Rd and a transistor TR. The transistor TR may be a selection device that supplies or blocks a current to the variable resistor device Rd according to a voltage of the word line WL, that is, a switching device. The transistor TR may be connected between the variable resistor device Rd and the word line WL, and the variable resistor device R may be connected between a bit line BL and the transistor TR. Positions of the transistor TR and the variable resistor device Rd may be changed with respect to each other. The memory cell MCd may be selected or not selected, according to ON or OFF of the transistor TR that is driven by the word line WL.

Referring back to FIG. 2, the write circuit 121 connected to a selected bit line provides the selected memory cell with a write pulse which is a voltage pulse or current pulse for a write operation to store data DATA in the memory cell array 110. The write pulse here may be referred to as a programming pulse. According to an exemplary embodiment, the write pulse may be a current pulse, and according to another exemplary embodiment, a write pulse may be a voltage pulse.

In detail, the write circuit 121 may perform a set write operation of programming the memory cell in a direction in which the resistance of the memory cell decreases, that is, in a set direction. Also, the write circuit 121 may perform a reset write operation of programming the memory cell in a direction in which the resistance of the memory cell increases, that is, in a reset direction.

According to an exemplary embodiment, the write circuit 121 may sequentially provide first through $n^{th}$ current pulses to the memory cell, and as the number of program loops increases, levels of the first through $n^{th}$ current pulses may increase. For example, the write circuit 121 sequentially provides the first through $n^{th}$ current pulses to the memory cell so as to perform a set write operation with regard to the memory cell.

According to another exemplary embodiment, the write circuit 121 may sequentially provide first through $n^{th}$ voltage pulses to the memory cell, and as the number of program loops increases, levels of the first through $n^{th}$ voltage pulses may increase. For example, the write circuit 121 sequentially provides the first through $n^{th}$ voltage pulses to the memory cell so as to perform a reset write operation with regard to the memory cell.

The read circuit 122 connected to the selected bit lines reads the data DATA stored in the selected memory cell. In detail, when a read command is received from the memory controller 200, the read circuit 122 may perform a normal read operation on the memory cell. Also, the read circuit 122 performs the read operation on the memory cell before the write operation is performed on the memory cell, and thus may perform a pre-read operation whereby an initial resistance state of the selected memory cell is read in advance.

Furthermore, after performing a write operation on the selected memory cell, the read circuit 122 may perform a verify read operation to determine whether writing to the selected memory cell is completed. In detail, the read circuit 122 reads resistance of the memory cells to which the first through $n^{th}$ current pulses are applied respectively and may provide a read result to the write circuit 121 or the control logic 130 to determine further write sequences are required to complete the write operation.

In a normal read operation, the read circuit 122 may provide the read data DATA to the outside of the memory device 100, for example, the memory controller 200. Also, in a pre-read operation or a verify read operation, the read circuit 122 may provide the read data DATA as a pass/fail signal P/F indicating a success/failure of a write operation, to the inside of the memory device 100, for example, to the control logic 130 or the write circuit 122.

According to the present exemplary embodiment, the write/read circuit 120 may be connected to the column decoder 160, and accordingly, to the bit line BL. However, the exemplary embodiments of the inventive concepts are not limited thereto, and according to another exemplary embodiment, the write/read circuit 120 may be connected to the row decoder 150, and accordingly, to the word line WL.

The control logic 130 may output various control signals to write data DATA to the memory cell array 110 or read data DATA from the memory cell array 110 based on a command CMD, an address ADDR, and a control signal CTRL received from the memory controller 200. Various control signals output from the control logic 130 may be provided to the write/read circuit 120, the voltage generating unit 140, the row decoder 150, and the column decoder 160, and accordingly, the control logic 130 may control various operations in the memory device 100 overall.

In detail, the control logic 130 may provide various operational control signals CTRL_op to the write/read circuit 120. For example, the operational control signals CTRL_op may include a write enable signal WEN, a read enable signal REN, a sense enable signal SEN, a discharge signal DIS, and a precharge enable signal PRE, and a write control signal. Also, the control logic 130 may provide a voltage control signal CTRL_vol to the voltage generating unit 140. Furthermore, the control logic 130 may provide a row address X_ADDR to the row decoder 150 and may provide a column address Y_ADDR to the column decoder 160.

In the present exemplary embodiment, the control logic 130 may set first and second inhibit voltage levels such that the first and second signal lines are at levels of the first and second inhibit voltages in an inhibit section before the write operation is performed on the selected memory cell. In addition, the control logic 130 may control timings at which predetermined voltages are applied to the first and second signal lines, in the inhibit section. The control logic 130 may generate a voltage control signal CTRL_vol by using information regarding the first and second inhibit voltage levels and the timings at which the predetermined voltages are applied and may provide the generated voltage control signal CTRL_vol to the voltage generating unit 140.

According to an exemplary embodiment, the control logic 130 may set the first and second inhibit voltage levels based on the voltage control signal CTRL_vol received from the memory controller 200. According to another exemplary embodiment, the control logic 130 may set or adjust the first and second inhibit voltage levels based on outputs of the write/read circuit 120. Operations of the control logic 130 will be described in detail with reference to FIGS. 8 through 14.

The voltage generating unit 140 may generate various types of voltages used to perform write, read, and erase operations on the memory cell 110 based on a voltage control signal CTRL_vol. In detail, the voltage generating unit 140 may generate a first operating voltage $V_{WL}$ used to operate a plurality of word lines and a second operating voltage $V_{BL}$ used to operate a plurality of bit lines.

In this case, the first operating voltage $V_{WL}$ may include a reset write voltage $V_{RESET}$, a set write voltage $V_{SET}$, a first inhibit voltage $V_{INHIBIT\_X}$, a read voltage $V_{READ}$, or a program verify voltage $V_{VERIFY}$. Also, the second operating voltage $V_{BL}$ may include a reset write voltage $V_{RESET}$, a set write voltage $V_{SET}$, and a second inhibit voltage $V_{INHIBIT\_Y}$. In the memory cell including the memory cell array 110, the reset write voltage $V_{RESET}$ and the set write voltage $V_{SET}$ may be applied to a word line or a bit line according to a connection direction of a selected device D.

The row decoder 150 may be connected to the memory cell array 110 via the plurality of word lines WL and may activate a selected word line from among the plurality of word lines WL in response to the row address X_ADDR received from the control logic 130. In detail, the row decoder 150 may control a voltage applied to a selected word line from among the plurality of word lines WL and may control a connection of selected word lines in response to a row address X_ADDR.

The column decoder 160 is connected to the memory cell array 110 via the plurality of bit lines BL and may activate a selected bit line from among the plurality of bit lines BL in response to the column address Y_ADDR received from the control logic 130. In detail, the column decoder 160 may control a voltage applied to a selected bit line from among the plurality of bit lines BL and may control a connection of selected bit lines in response to a column address Y_ADDR.

Figure 6:
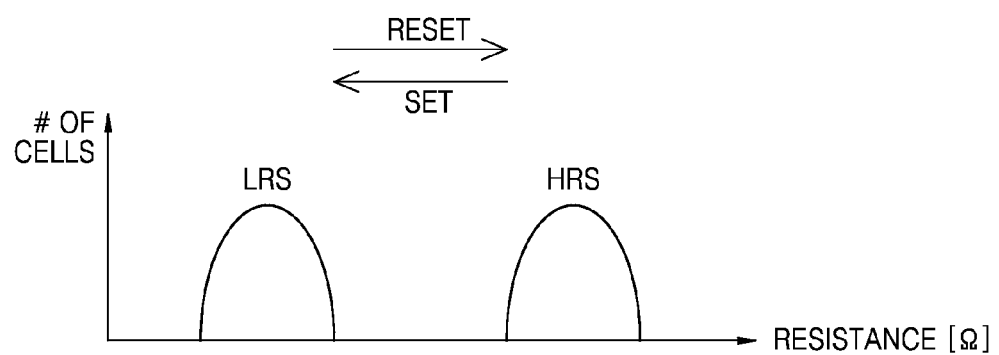
FIG. 6 illustrates an example of a resistance distribution of single level memory cells of FIG. 3.

FIG. 6 is a graph showing an example of a resistance distribution of single-level memory cells MC of FIG. 3.

Referring to FIG. 6, a horizontal axis denotes resistance, and a vertical axis denotes the number of memory cells MC. For example, if a memory cell MC is a single-level cell (SLC) that is programmed to 1 bit, the memory cell MC may have a low-resistance state (LRS) or a high-resistance state (HRS).

The LRS and the HRS may be any one of data '0' and data '1'. According to an exemplary embodiment, a resistance level R may be increased from the data '0' to the data '1'. That is, the LRS corresponds to the data '0', and the HRS corresponds to the data '1'.

An operation of applying a write pulse to the memory cell MC and switching the memory cell MC from a HRS to a LRS is referred to as a set operation or a set write operation. Also, an operation of applying a write pulse to the memory cell MC and switching the memory cell MC from a LRS to a HRS is referred to as a reset operation or a reset write operation.

Figure 7:
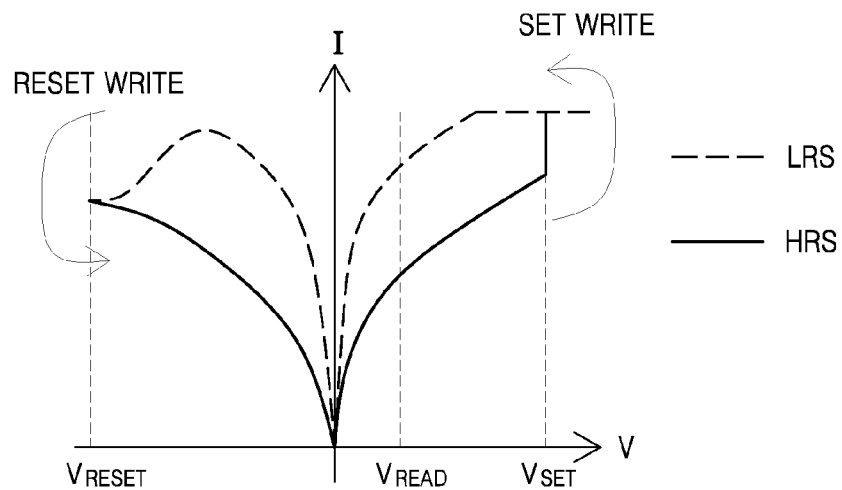
FIG. 7 is a graph showing an example of a voltage-current characteristic curve of a memory cell of FIG. 6.

FIG. 7 is a graph showing an example of a voltage-current characteristic curve of the memory cell MC having the distribution of FIG. 6.

Referring to FIG. 7, a horizontal axis denotes a voltage V, and a vertical axis denotes a current I. When the memory cell MC is a single-level cell (SLC), the memory cell MC may have either a HRS or a LRS according to the stored data. In detail, when a set voltage $V_{SET}$ is applied to a memory cell MC having the HRS, the memory cell MC may be switched to have the LRS. Meanwhile, when a reset voltage $V_{RESET}$ is applied to a memory cell MC having the LRS, the memory cell MC may be switched to have the HRS.

Figure 8:
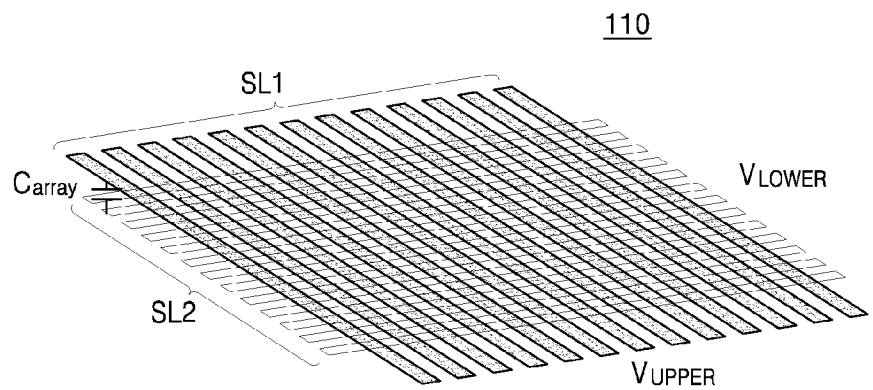
FIG. 8 is a schematic perspective view of an example of a portion of a memory cell array of FIG. 2.

FIG. 8 is a schematic perspective view of an example of a portion of the memory cell array 110 of FIG. 2.

Referring to FIG. 8, a plurality of first signal lines SL1 may be disposed on an upper plane in parallel in a first direction, and a plurality of second signal lines SL2 may be disposed on a lower plane in parallel in a second direction. In this case, the first direction and the second direction may be substantially perpendicular to each other. Also, a plurality of memory cells (not shown) may be disposed respectively in regions where the first signal lines SL1 and the second signal lines SL2 cross each other.

When the upper voltage $V_{UPPER}$ is applied to the first signal lines SL1 disposed on the upper plane, and when the lower voltage $V_{LOWER}$ is applied to the second signal lines SL2 disposed on the lower plane, the first signal lines SL1 disposed on the upper plane and the second signal lines SL2 disposed on the lower plane may be coupled to each other through capacitive coupling, and in this case, capacitance may be $C_{array}$. According to an exemplary embodiment, the first signal lines SL1 may be word lines, and the second signal lines SL2 may be bit lines. According to another exemplary embodiment, the first signal lines SL1 may be bit lines, and the second signal lines SL2 may be word lines.

Figure 9:
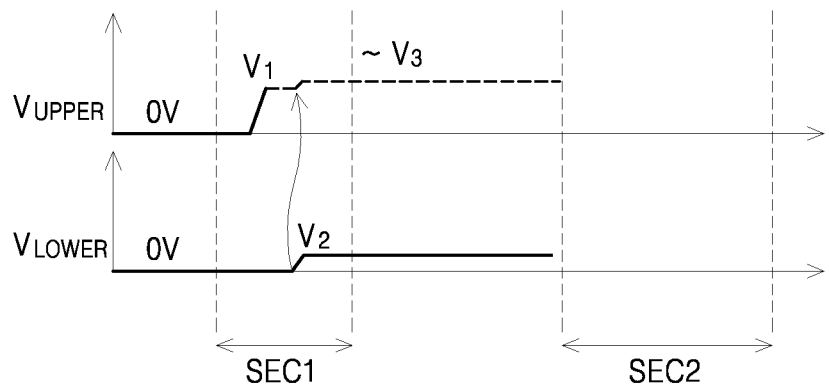
FIG. 9 is a timing diagram of voltage levels of signal lines of FIG. 8 in an inhibit section, according to an exemplary embodiment.

FIG. 9 is a timing diagram of voltage levels of signal lines of FIG. 8 in an inhibit section SEC1, according to an exemplary embodiment.

Referring to FIG. 9, a horizontal axis denotes time, and a vertical axis denotes voltage levels. According to the present exemplary embodiment, before the control logic (130 of FIG. 2) performs a write operation on the selected memory cell, a voltage level of first signal lines corresponds to a first inhibit voltage level, and a voltage level of second signal lines corresponds to a second inhibit voltage level. A section where the first and second signal lines are initialized, that is, a section where the voltage level of the first signal lines and the voltage level of the second signal lines are respectively set to the first inhibit voltage level and the second inhibit voltage level, is an inhibit section SEC1, and a section where a write operation is performed on the selected memory cell is a write section SEC2.

The voltage level $V_{UPPER}$ of the first signal lines SL1 and the voltage level $V_{LOWER}$ of the second signal lines SL2 may be 0 before the inhibit section SEC1. During the inhibit section SEC1, the first signal lines SL1 are floated after a first voltage corresponding to a first voltage level V1 is applied to the first signal lines SL1 and the voltage level $V_{UPPER}$ of the first signal lines SL1 may be maintained as the first voltage level V1. The first voltage level V1 may be lower than or equal to an external power voltage. Therefore, a separate charge pump is unnecessary to apply the first voltage to the first signal lines SL1.

Then, a second voltage corresponding to a second voltage level V2 may be applied to the second signal lines SL2. In this case, the second voltage level V2 may correspond to the second inhibit voltage level, and the second voltage level V2 may be lower than the first voltage level V1. Devices included in the write/read circuit 120 may normally operate by applying the second voltage to the second signal lines SL2 before the write section SEC2.

The first signal lines SL1 that are floated and the second signal lines SL2 to which the second voltage is applied may be coupled with each other through the capacitive coupling, and the voltage level of the first signal lines SL1 that are floated may be increased to a third voltage level V3 by the capacitive coupling. In this case, the third voltage level V3 may correspond to the first inhibit voltage level and may be greater than the external power voltage.

According to the present exemplary embodiment, even if the first inhibit voltage level is greater than the external power voltage, the voltage level of the first signal lines SL1 may be increased to the first inhibit voltage level through the capacitive coupling between the first signal lines SL1 that are floated and the second signal lines SL2 to which the second voltage is applied. Therefore, it is unnecessary to include a charge pump to boost a first inhibit voltage to be greater than external voltage.

Figure 10:
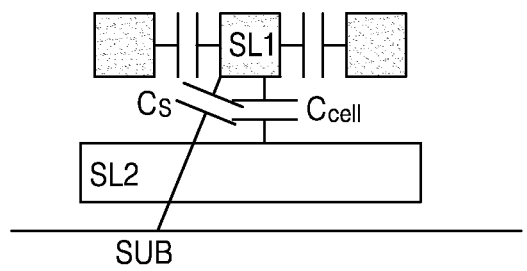
FIG. 10 is a schematic cross-sectional view of an example of a portion of the memory cell array of FIG. 2.

FIG. 10 is a schematic cross-sectional view of an example of a portion of the memory cell array 110 of FIG. 2.

Referring to FIG. 10, the first signal lines SL1 that are floated and the second signal lines SL2 may be coupled to each other through the capacitive coupling, and the voltage level of the first signal lines SL1 that are floated may be increased to a desired voltage level through the capacitive coupling. In this case, capacitance $C_{cell}$ between the first signal lines SL1 that are floated and the second signal lines SL2 may be obtained as shown in Formula 1 below.

$$C_{cell} = \in_{cell} {}^*A/d_{cell} \qquad \text{Formula 1}$$

where, $\in_{cell}$ is permittivity of a dielectric between the first signal lines SL1 and the second signal lines SL2, A is a surface area of the first signal lines SL1 which is exposed to capacitive coupling with the second signal lines, and $d_{cell}$ is a distance between the first signal lines SL1 and the second signal lines SL2 where the capacitive coupling is applied.

Also, the first signal lines SL1 that are floated may be connected to a substrate SUB through capacitive coupling, and the substrate SUB here may be a circuit area where the write/read circuit 120, the row decoder 160, or the column decoder 160 is arranged. The capacitance $C_s$ between the first signal lines SL1 that are floated and the substrate SUB may be obtained as shown in Formula 2 below.

$$C_s = \in_s {}^*A/d_s \qquad \text{Formula 2}$$

where, $C_s$ is permittivity of a dielectric between the first signal lines SL1 and the substrate SUB, A is the surface area of the first signal lines SL1 which is exposed to capacitive coupling with the substrate SUB, and $d_s$ is a distance between the first signal lines SL1 and the substrate SUB where the capacitive coupling is applied. In this case, when $\in_s = \alpha^* \in_{cell}$ and $d_s = \beta^* d_{cell}$, Formula 2 may be changed to Formula 3 below.

$$C_s = \alpha^*(1/\beta)^*C_{cell} \qquad \text{Formula 3}$$

In this case, a coupling ratio, K, is shown in Formula 4 below, and in the present exemplary embodiment, K may be equal to or greater than 80%.

$$K = C_{cell}/(C_s + C_{cell}) = \beta/(\alpha + \beta) \qquad \text{Formula 4}$$

Figure 11:
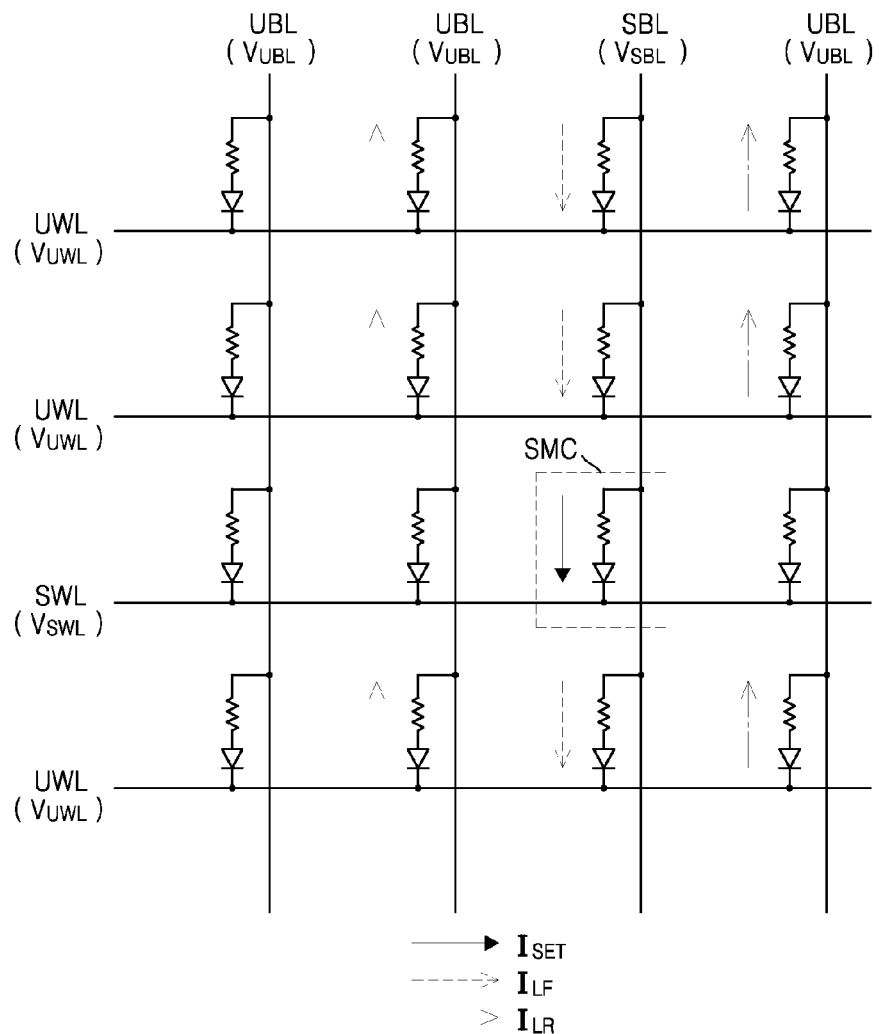
FIG. 11 is a circuit diagram of a memory cell array in which a write operation is performed, according to an exemplary embodiment.

FIG. 11 is a circuit diagram of a memory cell array 110a in which a write operation is performed, according to an exemplary embodiment.

Referring to FIG. 11, a plurality of bit lines may include a selected bit line SBL connected to a selected memory cell SMC and non-selected bit lines UBLs connected to non-selected memory cells. A plurality of word lines may include a selected word line SWL connected to the selected memory cell SMC and non-selected word lines UWLs connected to non-selected memory cells.

In a set write operation of decreasing a resistance level of the selected memory cell SMC, a relatively low voltage, for example, a voltage close to 0, may be applied to the selected word line SWL, and a relatively high voltage, for example, a set voltage $V_{SET}$, may be applied to the selected bit line SBL. Meanwhile, in a reset write operation of increasing a resistance level of the selected memory cell SMC, a relatively high voltage, for example, a reset voltage $V_{RESET}$, may be applied to the selected word line SWL, and a relatively low voltage, for example, a voltage close to 0, may be applied to the selected bit line SBL.

According to levels of voltages applied to the selected word line SWL and the selected bit line SBL, some of the non-selected memory cells are half selected where one of the electrode of the non-selected cell are selected while the other electrode is non-selected. A voltage difference between the two electrodes of the half selected memory cells may be generated. Accordingly, a leakage current $I_{LF}$ in a forward direction may be generated in some half selected memory cells, and a leakage current $I_{LR}$ in a reverse direction may be generated in other half selected memory cells. Before the write operation is performed on the selected memory cell SMC, a voltage level of the non-selected word lines UWLs may be set to be a first inhibit voltage $V_{INHIBIT\_X}$, and that of the non-selected bit lines UBLs may be set to be a second inhibit voltage $V_{INHIBIT\_Y}$ in order to minimize the leakage currents $I_{LF}$ and $I_{LR}$.

Figure 12:
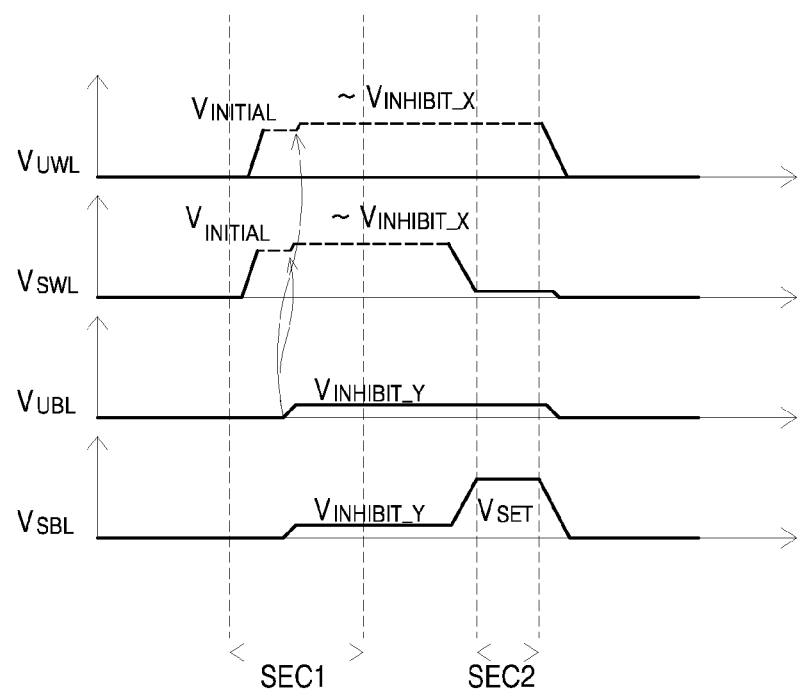
FIG. 12 is a timing diagram of voltage levels of signal lines included in a memory cell array of FIG. 11 when a write operation is performed, according to an exemplary embodiment.

FIG. 12 is a timing diagram of voltage levels of signal lines included in the memory cell array 110a of FIG. 11 when a write operation is performed, according to an exemplary embodiment.

Referring to FIG. 12, in the inhibit section SEC1, an initial voltage $V_{INITIAL}$ is applied to the selected word line SWL and the non-selected word lines UWLs so as to increase voltage levels of the selected word line SWL and the non-selected word lines UWLs. Then, the voltage levels of the selected word line SWL and the non-selected word lines UWLs are maintained as the initial voltage $V_{INITIAL}$ by floating the selected word line SWL and the non-selected word lines UWLs. In this case, the initial voltage $V_{INITIAL}$ may be lower than or equal to the external power voltage.

Then, the second inhibit voltage $V_{INHIBIT\_Y}$ is applied to the selected bit line SBL and the non-selected bit lines UBLs. In this case, the second inhibit voltage $V_{INHIBIT\_Y}$ may be lower than or equal to the initial voltage $V_{INITIAL}$. Accordingly, the voltage levels of the selected word line SWL and the non-selected word lines UWLs are increased to the first inhibit voltage level $V_{INHIBIT\_X}$, which is greater than the external power voltage, through capacitive coupling between the selected word line SWL and the non-selected word lines UWLs which are floated, and the selected bit line SBL and the non-selected bit lines UBLs.

In the write section SEC2, the voltage levels of the selected word line SWL and selected bit line SBL are changed to perform a set write operation or reset write operation. According to an exemplary embodiment, in the set write operation, a voltage applied to the selected word line SWL is decreased, and a set voltage $V_{SET}$ may be applied to the selected bit line SBL. According to an exemplary embodiment, in the reset write operation, a reset voltage $V_{RESET}$ is applied to the selected word line SWL, and a voltage applied to the selected bit line SBL may be decreased.

The number of selected word lines SWLs and selected bit lines SBLs which have changed voltage levels in the write section SEC2 is very small in comparison with the number of non-selected word lines UWLs and non-selected bit lines UBLs. Therefore, the voltage levels of the non-selected word lines UWLs and non-selected bit lines UBLs may be maintained as the voltage levels in the inhibit section SEC1. Accordingly, in the write section SEC2, the non-selected word lines UWLs may continue to have the first inhibit voltage level ($V_{INHIBIT\_X}$), and the non-selected bit lines UBLs may continue to have the second inhibit voltage level ($V_{INHIBIT\_Y}$), and thus, a leakage current flowing to the non-selected memory cells may be constant.

Figure 13:
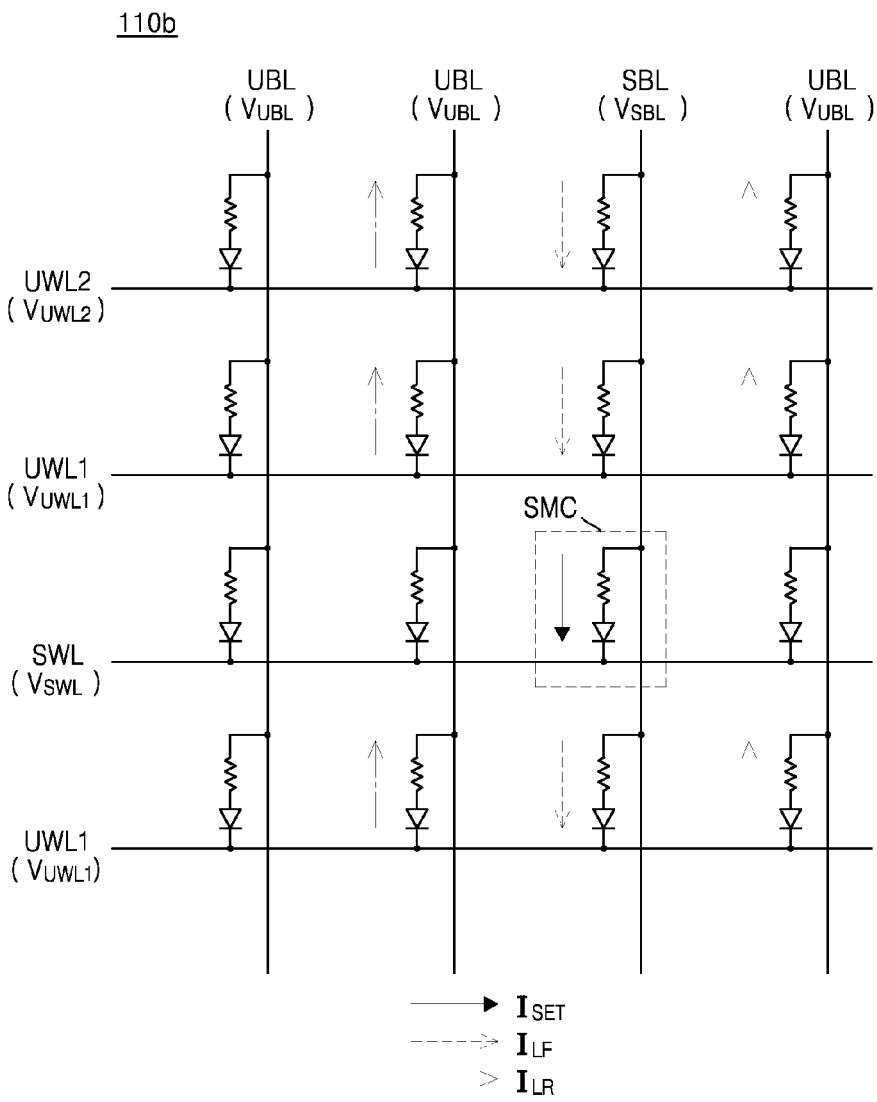
FIG. 13 is a circuit diagram of a memory cell array in which a write operation is performed, according to another exemplary embodiment.

FIG. 13 is a circuit diagram of a memory cell array 110b in which a write operation is performed, according to another exemplary embodiment.

Referring to FIG. 13, a plurality of bit lines may include a selected bit line SBL connected to a selected memory cell SMC and non-selected bit lines UBLs connected to non-selected memory cells, and a plurality of word lines may include a selected word line SWL connected to the selected memory cell SMC, adjacent non-selected word lines UWL1 disposed adjacent to the selected word line SWL, and a normal non-selected word line UWL2 that is not disposed adjacent to the selected word line SWL.

In a set write operation of decreasing a resistance value of a variable resistance of the selected memory cell SMC, a relatively low voltage, for example, a voltage close to 0, may be applied to the selected word line SWL, and a relatively high voltage, for example, a set voltage $V_{SET}$, may be applied to the selected bit line SBL. In a reset write operation of increasing a resistance value of the variable resistance of the selected memory cell SMC, a relatively high voltage, for example, a reset voltage $V_{RESET}$, may be applied to the selected word line SWL, and a relatively low voltage, for example, a voltage close to 0, may be applied to the selected bit line SBL.

According to levels of voltages applied to the selected word line SWL and the selected bit line SBL, a voltage difference between the two electrodes of the non-selected memory cells may be generated. Accordingly, a leakage current $I_{LF}$ in a forward direction may occur in some non-selected memory cells, and a leakage current $I_{LR}$ in a reverse direction may occur in other non-selected memory cells. Before a write operation is performed on the selected memory cell SMC, voltage levels of the adjacent non-selected word lines UWL1 and normal non-selected word line UWL2 are set to the first inhibit voltage $V_{INHIBIT\_X}$, and a voltage level of the non-selected bit lines UBLs may be set to second inhibit voltage $V_{INHIBIT\_Y}$ in order to minimize the leakage current $I_{LF}$ and leakage current $I_{LR}$.

In the present exemplary embodiment, the adjacent non-selected word lines UWL1 and the normal non-selected word line UWL2 may be differently controlled. In particular, before the write operation is performed on the selected memory cell SMC, the first inhibit voltage $V_{INHIBIT\_X}$ is applied to the adjacent non-selected word lines UWL1, and the normal non-selected word line UWL2 may remain floated. As the first inhibit voltage $V_{INHIBIT\_X}$ is applied to the adjacent non-selected word lines UWL1, the voltage level of the adjacent non-selected word lines UWL1 may not be changed even though the voltage level of the selected word line SWL is changed.

Although not illustrated, according to another exemplary embodiment, adjacent non-selected bit lines disposed adjacent to the selected bit line SBL and normal non-selected bit lines that are not disposed adjacent to the selected bit line SBL may be differently controlled. In detail, before the write operation is performed on the selected memory cell SMC, the second inhibit voltage $V_{INHIBIT\_Y}$ may be applied to the adjacent non-selected bit lines, and the normal non-selected bit lines may remain floated. As the second inhibit voltage $V_{INHIBIT\_Y}$ is applied to the adjacent non-selected bit lines, a voltage level of the adjacent non-selected bit lines may not be changed even though the voltage level of the selected bit line SBL is changed.

Figure 14:
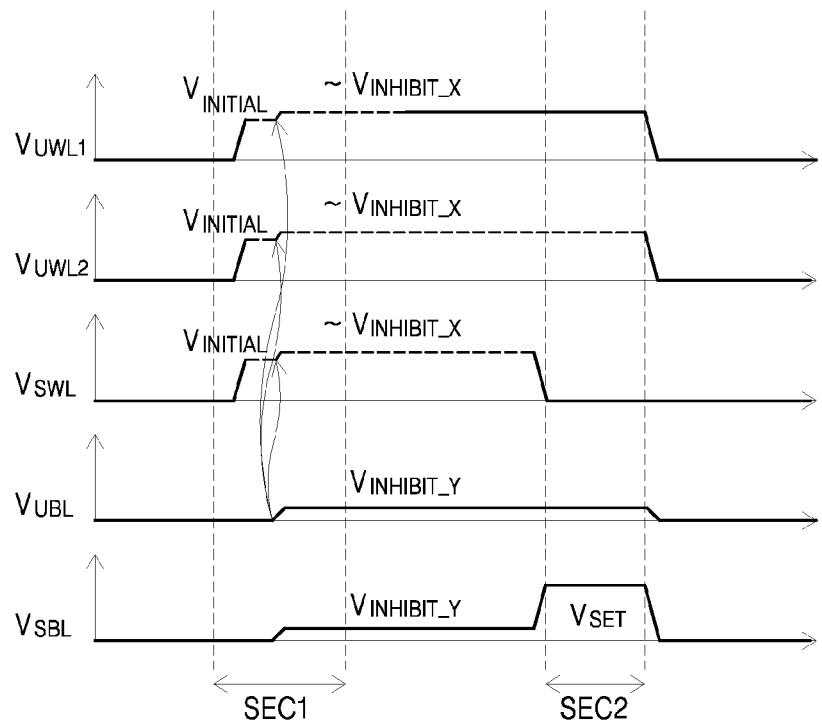
FIG. 14 is a timing diagram of voltage levels of signal lines included in the memory cell array of FIG. 13 when a write operation is performed, according to another exemplary embodiment.

FIG. 14 is a timing diagram of voltage levels of signal lines included in the memory cell array 110a of FIG. 13 when a write operation is performed, according to another exemplary embodiment.

Referring to FIG. 14, in the inhibit section SEC1, the initial voltage $V_{INITIAL}$ is applied to the selected word line SWL, adjacent non-selected word lines UWL1, and normal non-selected word line UWL2 so as to increase voltage levels of the selected word line SWL, adjacent non-selected word lines UWL1, and normal non-selected word line UWL2. Then, the voltage levels of the selected word line SWL, adjacent non-selected word lines UWL1, and normal non-selected word line UWL2 are maintained at the initial voltage $V_{INITIAL}$ by floating the selected word line SWL, adjacent non-selected word lines UWL1, and normal non-selected word line UWL2. In this case, the initial voltage $V_{INITIAL}$ may be lower than or equal to the external power voltage.

Then, the second inhibit voltage $V_{INHIBIT\_Y}$ is applied to the selected bit line SBL and the non-selected bit lines UBLs. In this case, the second inhibit voltage $V_{INHIBIT\_Y}$ may be lower than or equal to the initial voltage $V_{INITIAL}$. Thus, the voltage levels of the selected word line SWL, adjacent non-selected word lines UWL1 and normal non-selected word line UWL2 are increased to the first inhibit voltage level $V_{INHIBIT\_X}$ which is greater than the external power voltage due to capacitive coupling between the selected bit line SBL and non-selected bit lines UBLs, and the floated selected word line SWL, the floated adjacent non-selected word lines UWL1 and the floated normal non-selected word line UWL2

Then, the voltage level of the adjacent non-selected word lines UWL1 may be stably maintained as the first inhibit voltage $V_{INHIBIT\_X}$ by applying the first inhibit voltage $V_{INHIBIT\_X}$ thereto. In this case, it is required to include a charge pump configured to apply the first inhibit voltage $V_{INHIBIT\_X}$. For example, the voltage generating unit (140 of FIG. 2) may include the charge pump and may apply the first inhibit voltage $V_{INHIBIT\_X}$.

In the write section SEC2, the voltage levels of the selected word line SWL and selected bit line SBL may be changed in order to perform the set write operation or reset write operation. According to an exemplary embodiment, in the set write operation, the voltage applied to the selected word line SWL is decreased, and a set voltage $V_{SET}$ may be applied to the selected bit line SBL. According to an exemplary embodiment, in the reset write operation, a reset voltage $V_{RESET}$ is applied to the selected word line SWL, and the voltage of the selected bit line SBL may be decreased.

The number of selected word lines SWLs and selected bit lines SBLs having changed voltage levels in the write section SEC2 is fairly small in comparison with the number of the normal non-selected word line UWL2 and non-selected bit lines UBLs. Therefore, the voltage levels of the normal non-selected word line UWL2 and non-selected bit lines UBLs may be maintained as the voltage levels in the inhibit section SEC1. Therefore, in the write section SEC2, the normal non-selected word line UWL2 may continue to have the first inhibit voltage level $V_{INHIBIT\_X}$, and the non-selected bit lines UBLs may continue to have the second inhibit voltage level $V_{INHIBIT\_Y}$, thereby decreasing the leakage current flowing to the non-selected memory cells.

According to the present exemplary embodiment, instead of applying the first inhibit voltage level $V_{INHIBIT\_X}$ to all of the non-selected word lines, the first inhibit voltage level $V_{INHIBIT\_X}$ may be applied only to the adjacent non-selected word lines UWL1. Although the first inhibit voltage level $V_{INHIBIT\_X}$ is not applied to the normal non-selected word line UWL2, the normal non-selected word line UWL2 may maintain the voltage level that is increased to the first inhibit voltage level due to the capacitive coupling. Accordingly, a capacity of the charge pump may be greatly decreased, and thus, an area occupied by the charge pump is decreased. Furthermore, power consumption is also decreased.

Figure 15:
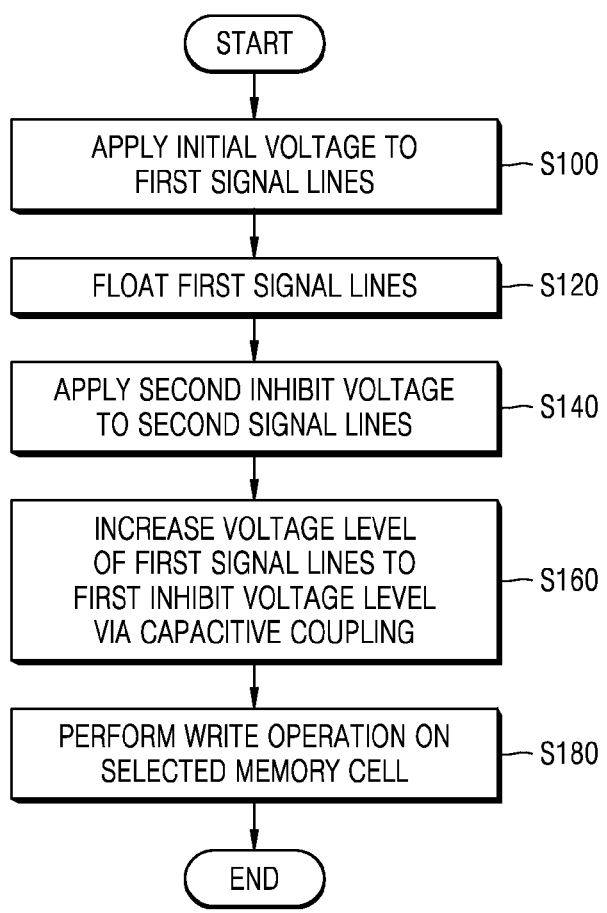
FIG. 15 is a flowchart of a method of operating a memory device, according to an exemplary embodiment.

FIG. 15 is a flowchart of a method of operating a memory device, according to an exemplary embodiment.

Referring to FIG. 15, the method of operating the memory device according to the present exemplary embodiment includes initializing first and second signal lines connected to a memory cell array in an inhibit section before a write operation is performed on memory cells, and performing the write operation on the memory cells in a write section. The descriptions provided with reference to FIGS. 1 through 14 are applied to the method of the present exemplary embodiment. In detail, operations S100 through S160 may be performed in the inhibit section, and operation S180 may be performed in the write section. Hereinafter, the method of operating the memory device according to the present exemplary embodiment will be described with reference to FIGS. 1 through 15.

In operation S100, an initial voltage is applied to the first signal lines. The initial voltage may be lower than or equal to an external power voltage applied to the memory device, and accordingly, it is unnecessary to include a charge pump configured to boost a voltage in order to apply the initial voltage. According to an exemplary embodiment, the first signal lines may be word lines, and according to another exemplary embodiment, the first signal lines may be bit lines. According to an exemplary embodiment, the first signal lines may be connected to an anode of a selection device included in a memory cell.

In operation S120, the first signal lines are floated. Accordingly, the floated first signal lines may continue to have an initial voltage level.

In operation S140, a second inhibit voltage is applied to the second signal lines. The second inhibit voltage may be lower than or equal to the initial voltage. As the second inhibit voltage is applied to the second signal lines, devices such as a transistor which is included in a peripheral circuit (for example, a write/read circuit, a row decoder, a column decoder, etc.) of the memory device may normally operate. According to an exemplary embodiment, the second signal lines may be bit lines, and according to another exemplary embodiment, the second signal lines may be word lines. According to an exemplary embodiment, the second signal lines may be connected to a cathode of a selection device included in a memory cell.

In operation S160, a voltage level of the first signal lines is increased to a first inhibit voltage level via capacitive coupling. In detail, the voltage level of the floated first signal lines may be increased from the initial voltage level to the first inhibit voltage level via capacitive coupling between the floated first signal lines and the second signal lines to which the second inhibit voltage is applied. The first inhibit voltage level here may be greater than the external power voltage. In the present exemplary embodiment, although a charge pump configured to apply the first inhibit voltage corresponding to the first inhibit voltage level is not included, the voltage level of the first signal lines may be increased to the first inhibit voltage level via the capacitive coupling.

In operation S180, a write operation is performed on the selected memory cell. According to an exemplary embodiment, a set write operation may be performed on the selected memory cell, and for example, a voltage of a selected first signal line is decreased, and a set voltage is applied to a selected second signal line so that a resistance level of the selected memory cell may be decreased. According to another exemplary embodiment, a reset write operation may be performed in the selected memory cell, and for example, a reset voltage is applied to the selected first signal line, and the voltage level of the selected memory cell may be increased by decreasing a voltage applied to the selected second signal line.

Figure 16:
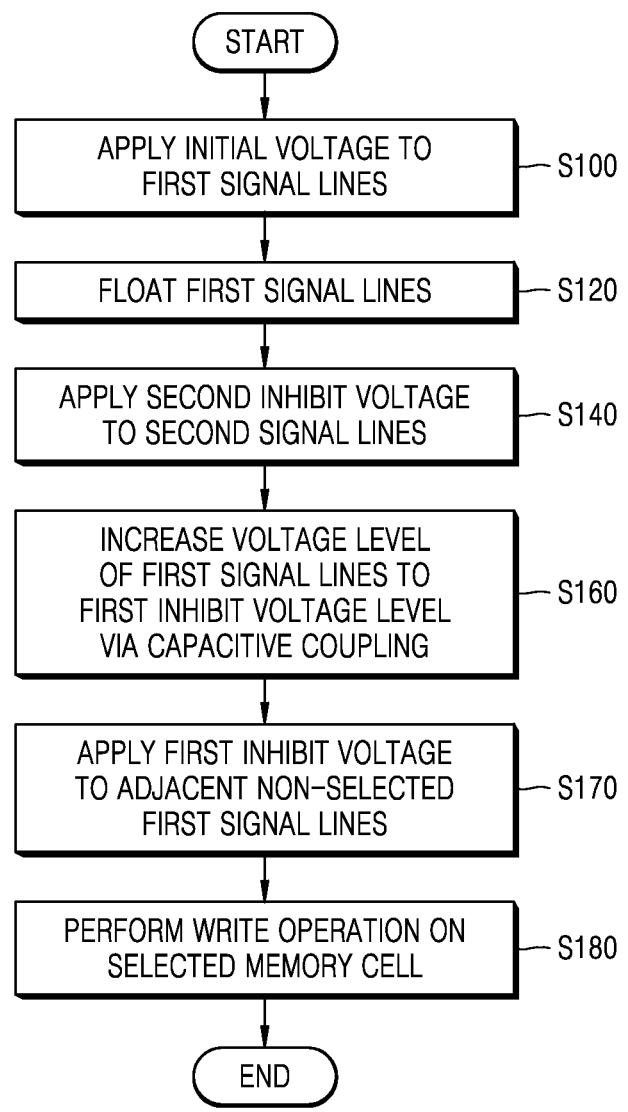
FIG. 16 is a flowchart of a method of operating a memory device, according to another exemplary embodiment.

FIG. 16 is a flowchart of a method of operating a memory device, according to another exemplary embodiment.

Referring to FIG. 16, the method of operating the memory device according to the present exemplary embodiment is a modified example of FIG. 15. In detail, the method of the present exemplary embodiment may further include operation S170, which is not included in the method of FIG. 15. Therefore, the descriptions provided with reference to FIG. 15 may be applied to the method of FIG. 16, and repeated descriptions will be omitted.

In operation S100, the initial voltage is applied to the first signal lines. In operation S120, the first signal lines are floated. In operation S140, the second inhibit voltage is applied to the second signal lines. In operation S160, the voltage level of the first signal lines is increased to the first inhibit voltage level via the capacitive coupling.

In operation S170, the first inhibit voltage is applied to adjacent non-selected first signal lines. The adjacent non-selected first signal lines may be disposed adjacent to the selected first signal line from among the first signal lines, and the first inhibit voltage is a voltage corresponding to the first inhibit voltage level. When the adjacent non-selected first signal lines are floated, a voltage level of the adjacent non-selected first signal lines may be changed due to a voltage change of the selected first signal line in the write section. The adjacent non-selected first signal lines are connected to a terminal used to apply the first inhibit voltage in order to prevent the change of the voltage level of the adjacent non-selected first signal lines, the voltage level of the adjacent non-selected first signal lines may be stably maintained as the first inhibit voltage level.

According to the present exemplary embodiment, the first inhibit voltage is applied only to the adjacent non-selected first signal lines that are arranged adjacent to the selected first signal line from among non-selected first signal line, and normal non-selected first signal lines maintain the first inhibit voltage level in a floated state. Therefore, since a capacity of a charge pump configured to apply the first inhibit voltage greater than the external power voltage may be greatly decreased, an area occupied by the charge pump may also be decreased, thereby decreasing power consumption.

In operation S180, the write operation is performed on the selected memory cell.

Figure 17:
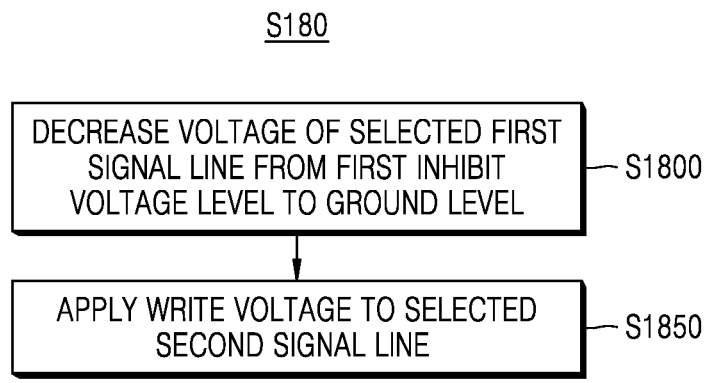
FIG. 17 is a flowchart of a write operation of a memory device according to another exemplary embodiment.

FIG. 17 is a flowchart of a write operation of a memory device according to another exemplary embodiment.

Referring to FIG. 17, the write operation of the memory device according to the present exemplary embodiment is an example of operation S180 of FIGS. 15 and 16 and is an example of a set write operation performed on a memory cell included in the memory device.

In operation S1800, a voltage applied to the selected first signal line is decreased from the first inhibit voltage level to a ground level. However, exemplary embodiments of the inventive concepts are not limited thereto, and according to another exemplary embodiment, a voltage of the selected first signal line may be decreased from the first inhibit voltage level to a voltage level lower than a write voltage. For example, the voltage of the selected first signal line may be decrease from the first inhibit voltage level to a voltage level close to the ground level.

In operation S1850, a write voltage is applied to the selected second signal line. The write voltage here may be at a voltage level at which a voltage difference between the selected second signal line and the selected first signal line may turn on a selection device included in the selected memory cell. Therefore, a set write operation of decreasing the resistance level of the selected memory cell may be performed.

Figure 18:
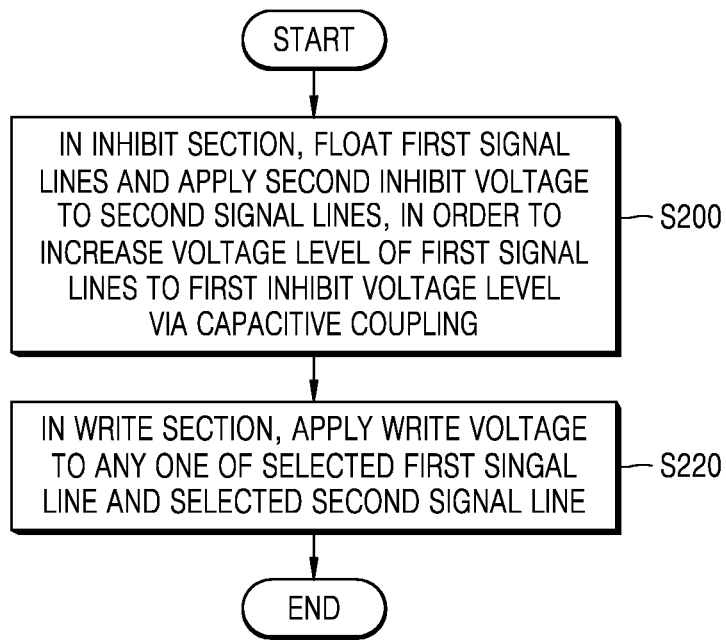
FIG. 18 is a flowchart of a method of operating a memory device according to another exemplary embodiment.

FIG. 18 is a flowchart of a method of operating a memory device according to another exemplary embodiment.

Referring to FIG. 18, the method of operating the memory device according to the present exemplary embodiment includes initializing first and second signal lines connected to a memory cell array in an inhibit section before a write operation is performed on memory cells and performing the write operation on the memory cells in a write section. The descriptions provided with reference to FIGS. 1 through 14 are applied to the method of the present exemplary embodiment. Hereinafter, referring to FIGS. 1 through 14 and 18, the method of operating the memory device according to the present exemplary embodiment will be described in detail.

In operation S200, in the inhibit section, the first signal lines are floated and the second inhibit voltage is applied to the second signal lines so that a voltage level of the first signal lines is increased to the first inhibit voltage level via capacitive coupling. In detail, in operation S200, the first signal lines are floated to have the initial voltage level that is lower than a level of the external power voltage, and the second inhibit voltage is applied to the second signal lines. The voltage level of the first signal lines may be increased to the first inhibit voltage level that is greater than the level of the external power voltage through the capacitive coupling.

In operation S220, in the write section, the write voltage is applied to any one of the selected first signal line and the selected second signal line. In this case, a voltage that is lower than the write voltage may be applied to the other one of the selected first signal line and the selected second signal line. According to an embodiment, when a reset voltage is applied to the selected first signal line, a reset write operation of increasing a resistance level of the selected memory cell may be performed. According to another embodiment, when a set voltage is applied to the selected second signal line, a set write operation of decreasing the resistance level of the selected memory cell may be performed.

Figure 19:
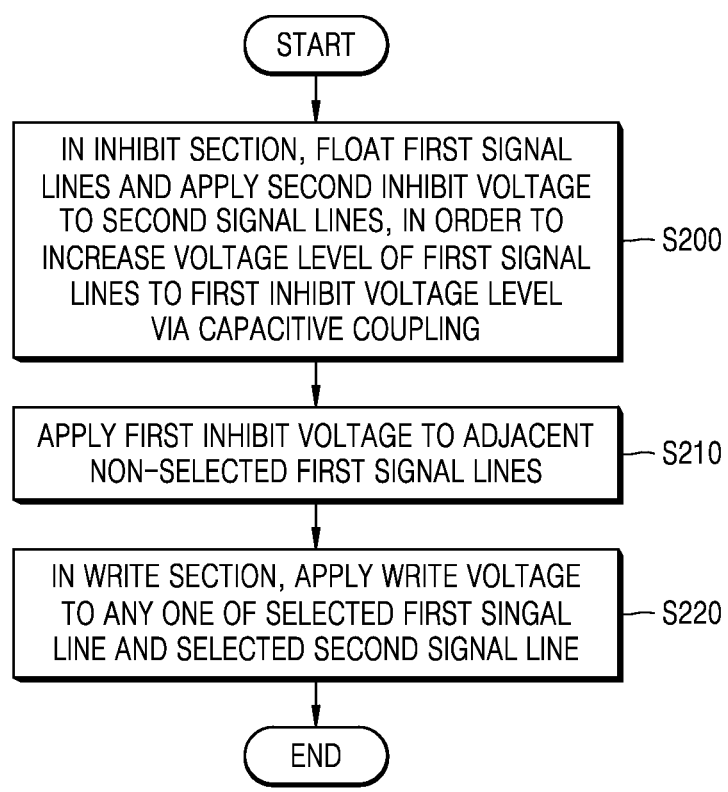
FIG. 19 is a flowchart of a method of operating a memory device according to another exemplary embodiment.

FIG. 19 is a flowchart of a method of operating a memory device according to another exemplary embodiment.

Referring to FIG. 19, the method of operating the memory device according to the present exemplary embodiment is a modified example of the method of FIG. 18. In detail, the method of operating the memory device may further include operation S210, which is not included in the method of FIG. 18. Therefore, the descriptions provided with reference to FIG. 18 may be applied to the method of FIG. 19, and repeated descriptions will be omitted.

In operation S200, in the inhibit section, the first signal lines are floated, and the second inhibit voltage is applied to the second signal lines so that the voltage level of the first signal lines is increased to the first inhibit voltage level via capacitive coupling.

In operation S210, the first inhibit voltage is applied to adjacent non-selected first signal lines. The adjacent non-selected first signal lines may be disposed adjacent to a selected first signal line from among the first signal lines, and the first inhibit voltage is a voltage corresponding to the first inhibit voltage level. If the adjacent non-selected first signal lines are floated, a voltage level of the adjacent non-selected first signal lines may be changed by a voltage change of the selected signal line in a write section. The adjacent non-selected first signal lines are connected to a terminal used to apply the first inhibit voltage in order to prevent the change of the voltage level of the adjacent non-selected first signal lines, and thus, the voltage level of the adjacent non-selected first signal lines may be stably maintained as the first inhibit voltage level.

According to the present exemplary embodiment, the first inhibit voltage is applied only to the adjacent non-selected first signal lines that are disposed adjacent to the selected first signal line from among the non-selected first signal lines, and normal non-selected first signal lines maintain the first inhibit voltage level in a floated state. Therefore, since a capacity of the charge pump configured to apply the first inhibit voltage greater than the external power voltage may be greatly decreased, an area occupied by the charge pump may also be decreased, thereby decreasing the power consumption.

In operation S220, in the write section, the write voltage is applied to any one of the selected first signal line and the selected second signal line.

Figure 20:
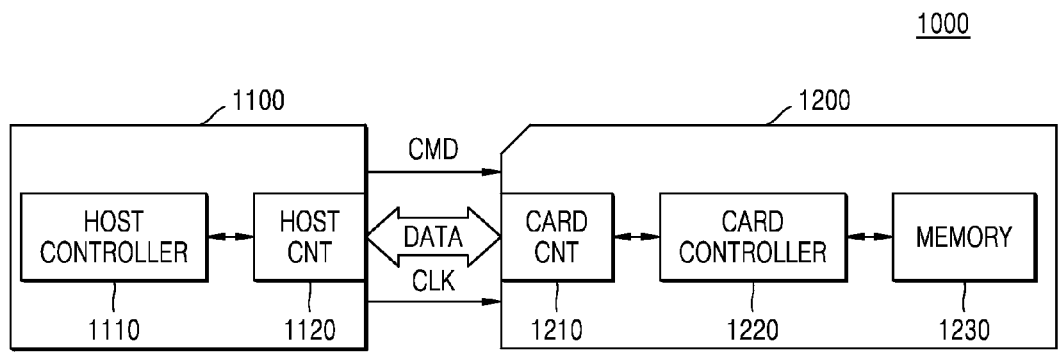
FIG. 20 is a block diagram of an example in which a memory system according to exemplary embodiments is applied to a memory card system.

FIG. 20 is a block diagram illustrating a memory system according to the exemplary embodiments of the inventive concepts, applied to a memory card system 1000.

Referring to FIG. 20, the memory card system 1000 may include a host 1100 and a memory card 1200. The host 1100 may include a host controller 1110 and a host connector 1120. The memory card 1200 may include a card connector 1210, a card controller 1220, and a memory 1230. The memory card 1200 may be implemented by using the embodiments illustrated in FIGS. 1 through 19.

The host 1100 may write data to the memory card 1200 or read data stored in the memory card 1200. The host controller 1110 may transmit a command CMD, a clock signal CLK generated in a clock generator (not shown) in the host 1100, and data DATA to the memory card 1200 through the host connector 1120.

In response to the command CMD received by using the card connector 1210, the card controller 1220 may store data in the memory 1230 in synchronization with a clock signal generated by a clock generator (not shown) in the card controller 1220. The memory 1230 may store data transmitted from the host 1100.

The memory card 1200 may be a compact flash card (CFC), a Microdrive, a smart media card (SMC), a multimedia card (MMC), a security digital card (SDC), a memory stick, or a universal serial bus (USB) flash memory driver.

Figure 21:
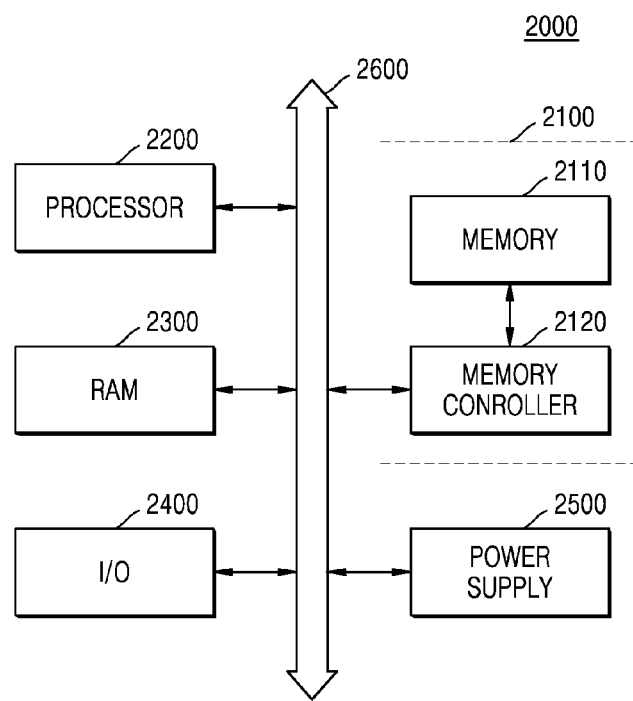
FIG. 21 is a block diagram of a computing system including a memory system according to exemplary embodiments.

FIG. 21 is a block diagram illustrating a computing system 2000 including a memory system 2100 according to exemplary embodiments of the inventive concepts.

Referring to FIG. 21, the computing system 2000 may include the memory system 2100, a processor 2200, a RAM 2300, an input/output device 2400, and a power supply 2500. Meanwhile, although not illustrated in FIG. 21, the computing system 2000 may further include ports via which to communicate with a video card, a sound card, a memory card, or a USB device, or other electronic appliances. The computing system 2000 may be a personal computer or a portable electronic device such as a laptop computer, a mobile phone, a personal digital assistant (PDA) or a camera.

The processor 2200 may perform particular computations or tasks. According to an exemplary embodiment, the processor 2200 may be a micro-processor or a central processing unit (CPU). The processor 2200 may perform communication with the RAM 2300, the input/output device 2400, and the memory system 2100 via a bus 2600 such as an address bus, a control bus, or a data bus. The memory system 2100 may be implemented by using the exemplary embodiments illustrated in FIGS. 1 through 20.

According to an exemplary embodiment, the processor 2200 may also be connected to an extension bus such as a peripheral component interconnect (PCI) bus.

The RAM 2300 may store data needed in operating the computing system 2000. For example, the RAM 2300 may be a DRAM, a mobile DRAM, an SRAM, a PRAM, an FRAM, an RRAM, and/or an MRAM.

The input/output device 2400 may include an input unit such as a keyboard, a keypad, or a mouse, and an output unit such as a printer or a display. The power supply 2500 may supply an operating voltage needed in operating the computing system 2000.

Figure 22:
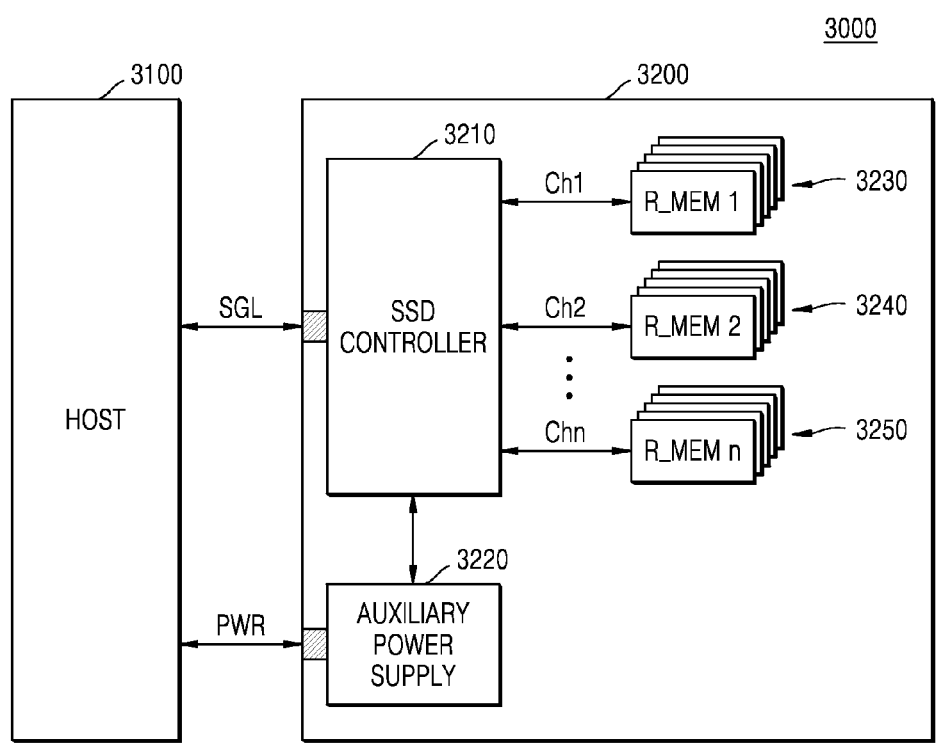
FIG. 22 is a block diagram of an example in which a memory system according to exemplary embodiments is applied to a solid state disk (SSD) system.

FIG. 22 is a block diagram illustrating a memory system according to exemplary embodiments of the inventive concepts, applied to a solid state disk (SSD) system 3000.

Referring to FIG. 22, the SSD system 3000 may include a host 3100 and an SSD 3200. The SSD 3200 may transmit or receive a signal to and from the host 3100 via a signal connector, and may receive power via a power connector. The SSD 3200 may include an SSD controller 3210, an auxiliary power supply 3220, and a plurality of memory devices 3230, 3240, and 3250. The SSD 3200 may be implemented by using the exemplary embodiments illustrated in FIGS. 1 through 21.

While the inventive concepts have been particularly shown and described with reference to exemplary embodiments thereof, it will be understood that various changes in form and details may be made therein without departing from the spirit and scope of the following claims.

What is claimed is:

1. A method of operating a memory device including a plurality of memory cells disposed in regions where a plurality of first signal lines and a plurality of second signal lines cross each other, the method comprising:
applying an initial voltage to the plurality of first signal lines;
floating the plurality of first signal lines to which the initial voltage is applied; and
applying a second inhibit voltage to the plurality of second signal lines;
wherein voltage levels of the plurality of first signal lines are increased to a first inhibit voltage level through capacitive coupling between the plurality of first signal lines which are floated and the plurality of second signal lines to which the second inhibit voltage is applied.

2. The method of claim 1, further comprising performing a write operation on a selected memory cell by applying a write voltage to one of a selected first signal line and a selected second signal line connected to the selected memory cell.

3. The method of claim 2, wherein the performing of the write operation comprises:
decreasing a voltage of the selected first signal line; and
applying the write voltage to the selected second signal line.

4. The method of claim 3, further comprising applying a first inhibit voltage corresponding to the first inhibit voltage level to adjacent non-selected first signal lines disposed adjacent to the selected first signal line from among the plurality of first signal lines which are floated.

5. The method of claim 4, wherein the applying of the first inhibit voltage is performed before performing the write operation.

6. The method of claim 3, wherein the decreasing of the voltage of the selected first signal line comprises decreasing a level of the voltage of the selected first signal line from the first inhibit voltage level to a ground voltage level, and
the applying of the write voltage to the selected second signal line comprises applying the write voltage greater than the second inhibit voltage to the selected second signal line.

7. The method of claim 2, wherein the performing of the write operation comprises:
applying the write voltage to the selected first signal line; and
decreasing a voltage of the selected second signal line.

8. The method of claim 2, further comprising:
maintaining a float state of a non-selected first signal line connected to a non-selected memory cell from among the plurality of first signal lines in a write section where the write operation is performed on the selected memory cell; and
applying the second inhibit voltage to a non-selected second signal line connected to the non-selected memory cell from among the plurality of second signal lines in the write section.

9. The method of claim 2, further comprising:
applying a first inhibit voltage corresponding to the first inhibit voltage level to adjacent non-selected first signal lines disposed adjacent to the selected first signal line from among the plurality of first signal lines in a write section where the write operation is performed on the selected memory cell;
maintaining a float state of normal non-selected first signal lines that are not disposed adjacent to the selected signal line from among the plurality of first signal lines in the write section; and
applying the second inhibit voltage to a non-selected second signal line connected to the non-selected memory cell from among the plurality of second signal lines in the write section.

10. The method of claim 1, wherein the initial voltage is lower than or equal to an external power voltage applied to the memory device, and
the first inhibit voltage level is greater than a level of the external power voltage.

11. The method of claim 1, wherein the second inhibit voltage is lower than the initial voltage.

12. A method of operating a memory device including a plurality of memory cells disposed in regions where a plurality of first signal lines and a plurality of second signal lines cross each other, the method comprising:
floating the plurality of first signal lines and applying a second inhibit voltage to the plurality of second signal lines in an inhibit section, and thus, increasing voltage levels of the plurality of first signal lines to a first inhibit voltage level through capacitive coupling between the plurality of first signal lines that are floated and the plurality of second signal lines to which the second inhibit voltage is applied; and
applying a write voltage to any one of a selected first signal line and a selected second signal line connected to a selected memory cell in a write section.

13. The method of claim 12, further comprising applying a first inhibit voltage corresponding to the first inhibit voltage level to adjacent non-selected signal lines disposed adjacent to the selected first signal lines from among the plurality of first signal lines, before the write section.

14. The method of claim 12, wherein the increasing of the voltage levels of the plurality of first signal lines to the first inhibit voltage level comprises:
floating the plurality of first signal lines to have an initial voltage level that is lower than or equal to an external power voltage; and
applying the second inhibit voltage to the plurality of second signal lines;
wherein the voltage levels of the plurality of first signal lines are increased to the first inhibit voltage level greater than the external power voltage through capacitive coupling.

15. The method of claim 12, wherein the applying of the write voltage to any one of the selected first signal line and the selected second signal line comprises:
decreasing a voltage of the selected first signal line from the first inhibit voltage level to a ground voltage level; and
applying the write voltage greater than the second inhibit voltage to the selected second signal line.

16. The method of claim 12, further comprising:
maintaining a float state of a non-selected first signal line connected to a non-selected memory cell from among the plurality of first signal lines in the write section; and
applying the second inhibit voltage to a non-selected second signal line connected to the non-selected memory cell from among the plurality of second signal lines in the write section.

17. The method of claim 12, further comprising:
applying a first inhibit voltage corresponding to the first inhibit voltage level to adjacent non-selected first signal lines disposed adjacent to the selected first signal line from among the plurality of first signal lines in the write section;
maintaining a float state of normal non-selected first signal lines that are not disposed adjacent to the selected signal line from among the plurality of first signal lines in the write section; and
applying the second inhibit voltage to a non-selected second signal line connected to the non-selected memory cell from among the plurality of second signal lines in the write section.

18. A method of operating a memory system comprising a memory controller and a memory device comprising a plurality of memory cells disposed in regions where a plurality of first signal lines and a plurality of second signal lines cross each other, the method comprising:
transmitting a write command from the memory controller to the memory device; and
performing a write operation on a selected memory cell, in response to the write command;
wherein the performing of the write operation comprises:
floating the plurality of first signal lines and applying a second inhibit voltage to the plurality of second signal lines in an inhibit section, and thus, increasing voltage levels of the plurality of first signal lines to a first inhibit voltage level via capacitive coupling between the plurality of first signal lines that are floated and the plurality of second signal lines to which the second inhibit voltage is applied; and
applying a write voltage to any one of a selected first signal line and a selected second signal line connected to the selected memory cell in a write section.

19. The method of claim 18, wherein the performing of the write operation further comprises: applying a first inhibit voltage corresponding to the first inhibit voltage level to adjacent non-selected signal lines disposed adjacent to the selected first signal lines from among the plurality of first signal lines, before the write section.

20. The method of claim 18, wherein the increasing of the voltage levels of the plurality of first signal lines to the first inhibit voltage level comprises:
floating the plurality of first signal lines to have an initial voltage level that is lower than or equal to an external power voltage; and applying the second inhibit voltage to the plurality of second signal lines;
wherein the voltage levels of the plurality of first signal lines are increased to the first inhibit voltage level greater than the external power voltage via capacitive coupling.

* * * * *